(12) United States Patent
Chu et al.

(10) Patent No.: US 7,501,693 B2
(45) Date of Patent: Mar. 10, 2009

(54) LDO REGULATOR WITH GROUND CONNECTION THROUGH PACKAGE BOTTOM

(75) Inventors: George Chu, Fremont, CA (US);
Martin Alter, Los Altos, CA (US)

(73) Assignee: Micrel, Inc., San Jose, CA (US)

( * ) Notice: Subject to any disclaimer, the term of this patent is extended or adjusted under 35 U.S.C. 154(b) by 175 days.

(21) Appl. No.: 11/561,175

(22) Filed: Nov. 17, 2006

(65) Prior Publication Data
US 2008/0135994 A1 Jun. 12, 2008

(51) Int. Cl.
*H01L 23/495* (2006.01)
*H01L 23/04* (2006.01)

(52) U.S. Cl. .................. 257/676; 257/666; 257/698; 257/E23.061

(58) Field of Classification Search .......... 257/666, 257/676, 698, E23.061
See application file for complete search history.

(56) References Cited

U.S. PATENT DOCUMENTS

| | | | |
|---|---|---|---|
| 4,110,782 A | 8/1978 | Nelson et al. | |
| 5,122,860 A * | 6/1992 | Kikuchi et al. | 257/679 |
| 5,157,475 A * | 10/1992 | Yamaguchi | 257/784 |
| 6,828,660 B2 * | 12/2004 | Abbott | 257/666 |
| 6,903,448 B1 * | 6/2005 | Sutardja et al. | 257/666 |
| 7,015,591 B2 | 3/2006 | Lee | |
| 7,109,572 B2 | 9/2006 | Fee et al. | |
| 7,119,421 B2 | 10/2006 | Rohrmoser et al. | |
| 2008/0079148 A1 * | 4/2008 | Leung et al. | 257/734 |

OTHER PUBLICATIONS

"MicroLeadFrame." Amkor Technology, Data Sheet and related webpages, Jul. 2005, 5 pages.
"LM4040/4041 Precision Micropower Shunt Voltage Reference," Micrel, Inc., Data Sheet, Mar. 2005, pp. 1-16.
"MIC5301 Single, 150mA µCap ULDO™," Micrel, Inc., Data Sheet, Aug. 2006, pp. 1-10.

* cited by examiner

*Primary Examiner*—Nitin Parekh
(74) *Attorney, Agent, or Firm*—Patent Law Group LLP; Carmen C. Cook

(57) ABSTRACT

A low dropout (LDO) regulator device includes an LDO regulator integrated circuit housed in a 4-pin quad flat no-lead (QFN) package where the exposed die paddle is used as the ground terminal. The LDO regulator integrated circuit is formed on a semiconductor substrate. The 4-pin QFN package includes four perimeter lands connected to the input terminal, the output terminal, the enable terminal and the bypass terminal of the LDO regulator integrated circuit. The die paddle is to be electrically connected to a ground potential to allow the ground current of the LDO regulator integrated circuit to flow through the substrate and the die paddle of the 4-pin QFN package.

8 Claims, 2 Drawing Sheets

LDO REGULATOR WITH GROUND CONNECTION THROUGH PACKAGE BOTTOM

FIELD OF THE INVENTION

The invention relates to low dropout regulators and, in particular, to a low dropout regulator housed in a four-pin quad flat no-lead package with the ground connection provided at the package bottom.

DESCRIPTION OF THE RELATED ART

A low dropout (LDO) regulator is a DC linear voltage regulator which has a very small input-output differential voltage, such as less than 2 volts. The dropout voltage, the minimum voltage that the input voltage must be higher than the output voltage, determines the lowest usable supply voltage for the regulator. If, for example, the LDO has a dropout voltage around 700 mV (0.7V), a 3.3V output would require the input to be at least 4V.

FIG. 1 is a block diagram of a conventional LDO regulator with fixed output voltage. LDO regulator 10 with fixed output voltage includes five input-output (I/O) terminals: VIN, VOUT, EN (Enable), BYP (Bypass), and GND (ground). The main components of LDO regulator 10 include a power FET (field effect transistor) M1 and a differential amplifier operating as an error amplifier 12. The power FET M1 is connected across the input voltage VIN and the output voltage VOUT with the gate terminal being controlled by the error amplifier 12. One input of the error amplifier 12 monitors a percentage of the output voltage VOUT, as determined by the resistor ratio of resistors R1 and R2. The second input to the error amplifier 12 is a stable voltage reference $V_{REF}$. Error amplifier 12 monitors the output voltage VOUT relative to the reference voltage $V_{REF}$ and modulates the gate drive of the power FET to maintain a constant output voltage VOUT.

The typical LDO regulator 10 includes the enable EN terminal to allow the regulator to be disabled. When the LDO regulator is disabled, the regulator consumes near zero current. The LDO regulator 10 also includes a bypass BYP terminal for stabilization. A capacitor and/or a resistor to ground can be coupled to the bypass terminal to realize output noise reduction.

Due to cost and space constraints, LDO regulators are typically provided in very small packages. For example, LDO regulators have been packaged in quad flat no-lead (QFN) packages. One type of QFN packages is known as MicroLeadframe (MLF) available from Amkor Technology, Chandler, Ariz. The QFN package is a near-wafer-level-packaging plastic encapsulated package with a leadframe substrate. The leadframe is typically copper. FIG. 2 is the bottom view of a conventional QFN package housing the LDO regulator of FIG. 1. FIG. 3 is a cross-sectional view of the QFN package of FIG. 2.

The QFN package 20 includes a semiconductor die 32 attached to a die paddle 24 where bond pads on the semiconductor die 32 are electrically connected to conductive leads of the leadframe forming the perimeter lands 22. QFN package 20 is encapsulated by an encapsulant 26 with the perimeter lands 22 and the die paddle exposed along the bottom surface of the package. The perimeter lands 22 may also be exposed along the side surfaces, perpendicular to the bottom surface, of the package.

QFN package 20 uses perimeter lands 22 on the bottom surface of the package to provide electrical contact from the encapsulated die 32 to a printed wiring board (PWB). The exposed die paddle 24 on the bottom surface of the QFN package 20 functions as a heat sink. The exposed die paddle is typically soldered directly to the PWB to provide a heat conduction path for heat dissipation. To ensure a stable ground, the exposed die paddle 24 is usually grounded through the use of down-bonds, either from a lead to the die paddle (wire 36) or from the die down to the die paddle (wire 38).

The conventional LDO regulator with fixed output voltage includes at least five I/O terminals and therefore requires a package with at least five pins. For instance, in FIG. 2, the LDO regulator is packaged in a 6-pin QFN package with one pin being the No Connect (N/C) pin. There is need to provide an LDO regulator in smaller packages for cost reduction and space efficiency.

SUMMARY OF THE INVENTION

According to one embodiment of the present invention, a low dropout (LDO) regulator device including an LDO regulator integrated circuit and a 4-pin quad flat no-lead (QFN) package housing the LDO regulator integrated circuit. The LDO regulator integrated circuit is formed on a semiconductor substrate. The LDO regulator integrated circuit has an input terminal receiving an input voltage, an output terminal providing an output voltage, an enable terminal receiving an enable signal and a bypass terminal for stabilization. The 4-pin QFN package includes four conductive leads for connecting to the input terminal, the output terminal, the enable terminal and the bypass terminal of the LDO regulator integrated circuit through respective bond wires, a die paddle on which a bottom surface of the LDO regulator integrated circuit is attached using a conductive die attach where the die paddle forms the ground terminal of the LDO regulator integrated circuit, and an encapsulant encapsulating the four conductive leads, the bond wires, the LDO regulator integrated circuit, and the die paddle. The encapsulant exposes the bottom surface of the die paddle and at least bottom surfaces of the four conductive leads forming corresponding four perimeter lands. The die paddle is to be electrically connected to a ground potential to allow a ground current of the LDO regulator integrated circuit to flow through the substrate and the die paddle of the 4-pin QFN package.

According to another aspect of the present invention, an electronic device includes an integrated circuit and an N-pin quad flat no-lead (QFN) package housing the integrated circuit. The integrated circuit is formed on a semiconductor substrate where the integrated circuit includes one or more input-output terminals. The N-pin QFN package includes N conductive leads for connecting to the one or more input-output terminals of the integrated circuit through respective bond wires, a die paddle on which a bottom surface of the integrated circuit is attached using a conductive die attach where the die paddle forms the ground terminal of the integrated circuit, and an encapsulant encapsulating the N conductive leads, the bond wires, the integrated circuit, and the die paddle and exposing the bottom surface of the die paddle and at least bottom surfaces of the N conductive leads forming corresponding N perimeter lands. The die paddle is to be electrically connected to a ground potential to allow a ground current of the integrated circuit to flow through the substrate and the die paddle of the N-pin QFN package.

DETAILED DESCRIPTION OF THE PREFERRED EMBODIMENTS

In accordance with the principles of the present invention, an LDO regulator is housed in a 4-pin quad flat no-lead (QFN) package using a 4-pin-plus-ground configuration where the exposed die paddle of the QFN package is used as the ground terminal. Specifically, none of the four perimeter lands of the 4-pin QFN package is used as the ground pin. The ground current of the LDO regulator flows through the substrate and the bottom die paddle to ground. In this manner, the LDO regulator can be housed in a 4-pin QFN package, reducing the package size of the LDO regulator device significantly from the conventional 6-pin QFN package. When the LDO regulator is housed in a 4-pin QFN package, the LDO regulator device has a size commensurate with a LDO regulator packaged using wafer-level packaging. The size reduction realized by the 4-pin-plus ground configuration of the present invention provides significant advantages for allowing the LDO regulator to be used in applications requiring increasingly smaller footprints.

Figure 1:
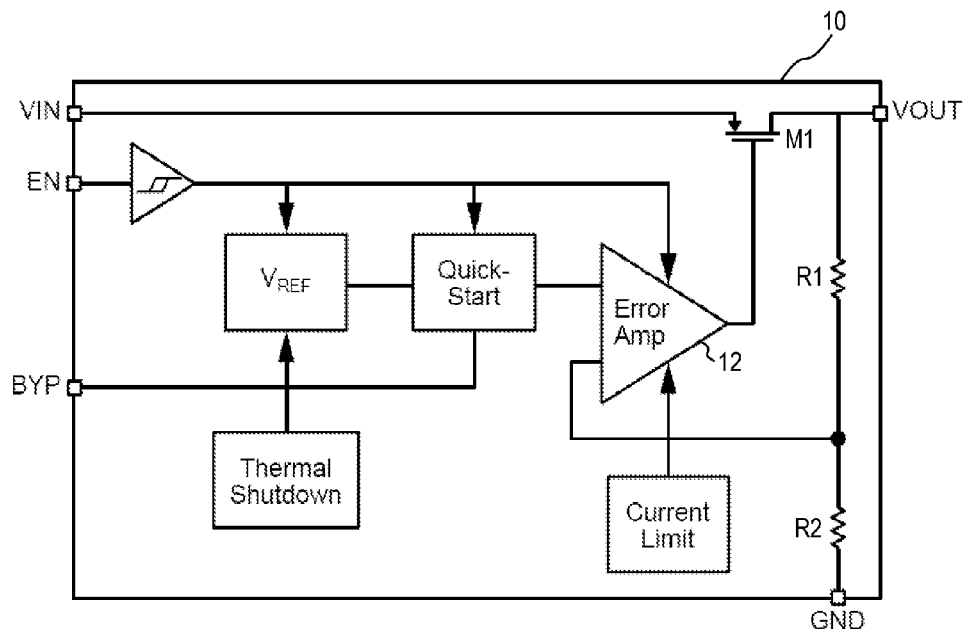
FIG. 1 is a block diagram of a conventional LDO regulator with fixed output voltage.

A salient characteristic of the LDO regulator is that the LDO regulator dissipates a very small amount of ground current $I_{gnd}$ during device operation. In the present description, the ground current $I_{gnd}$ refers to the current flowing through to the ground terminal of the LDO regulator. Referring back to FIG. 1, in LDO regulator 10, the main current path of LDO regulator 10 is from the input voltage VIN to the output voltage VOUT. During normal LDO operation, a small amount of ground current $I_{gnd}$ flows out of the ground GND terminal. Typically, the ground current $I_{gnd}$ is less than 120 μA. When the LDO regulator is in the shut-down mode (by deasserting the EN terminal), the ground current $I_{gnd}$ decreases down to a near zero value, such as 2 μA.

In accordance with the present invention, the low ground current characteristic of the LDO regulator is exploited to eliminate the need for a ground pin. Instead, the substrate of the LDO regulator is used as the ground terminal. In this manner, an LDO regulator with fixed output voltage can be housed in a QFN package with only 4 package pins and the exposed die paddle of the QFN package implements dual functions of a heat sink and a ground pin. Thus, the 4 package pins of the QFN package include input-output pins for the input voltage VIN, the output voltage VOUT, the enable pin EN and the bypass pin BYP. The ground pin is taken from the exposed die paddle at the bottom surface of the QFN package.

Figure 2:
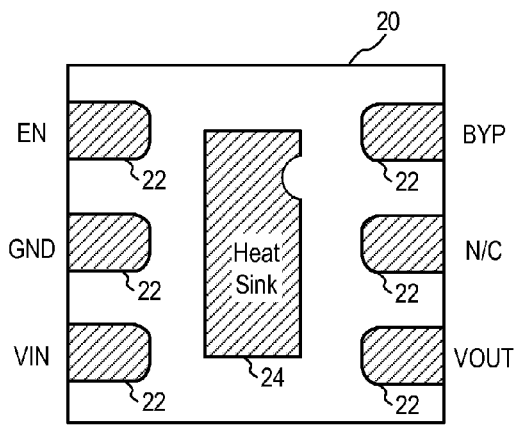
FIG. 2 is the bottom view of a conventional QFN package housing the LDO regulator of FIG. 1.
Figure 3:
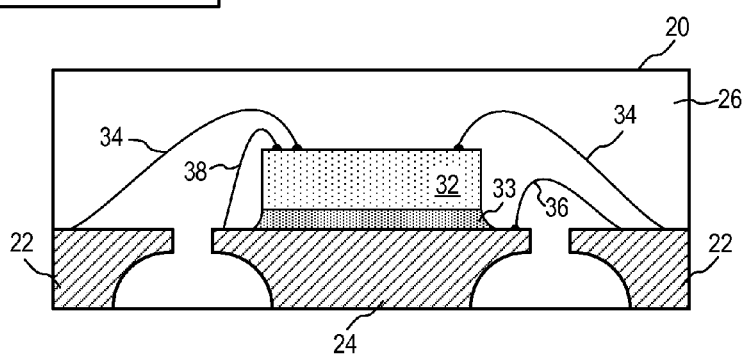
FIG. 3 is a cross-sectional view of the QFN package of FIG. 2.

When packaged into 4-pin QFN, the LDO regulator device can have a size commensurate with wafer level packaging. Wafer level packaging, also called chip scale package, refers to a package that is almost the same size as the semiconductor die. When the LDO regulator is built using a 6-pin QFN package, such as that shown in FIG. 2, the resulting package size is much bigger than a wafer level package. However, by using the 4-pin-plus-ground configuration of the present invention to allow the LDO regulator to be housed in a 4-pin QFN package, the size of the package is reduced significantly so that the size of the LDO regulator device is comparable to the size of a wafer-level packaged LDO regulator.

Figure 4:
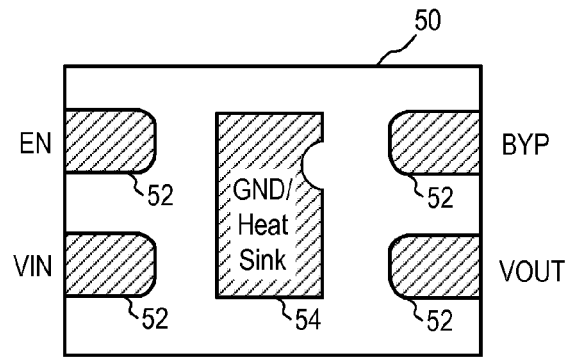
FIG. 4 is the bottom view of a QFN package implementing the 4-pin-plus-1-ground configuration for housing an LDO regulator integrated circuit according to one embodiment of the present invention.
Figure 5:
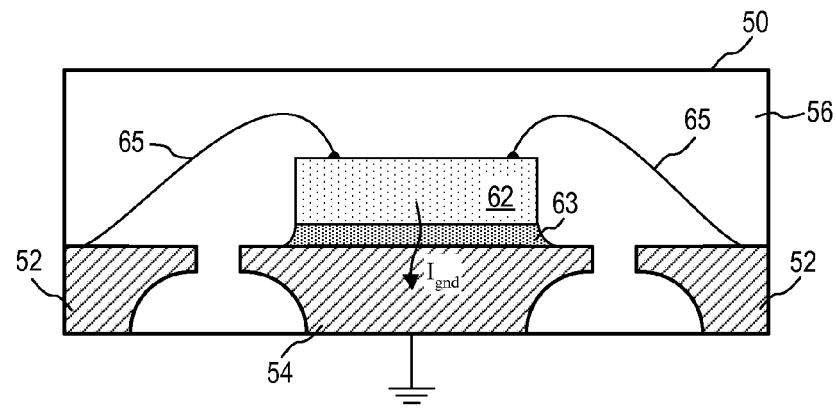
FIG. 5 is a cross-sectional view of the QFN package of FIG. 4.

FIG. 4 is the bottom view of a QFN package implementing the 4-pin-plus-ground configuration for housing an LDO regulator according to one embodiment of the present invention. FIG. 5 is a cross-sectional view of the QFN package of FIG. 4. Referring to FIGS. 4 and 5, a 4-pin QFN package 50 for housing an LDO regulator integrated circuit (die 62) includes four perimeter lands 52 forming the I/O pins of the package. The four perimeter lands are assigned to the input voltage (VIN), the output voltage (VOUT), the enable (EN) terminal, and the bypass (BYP) terminal of the LDO regulator. The exposed die paddle on the bottom surface of package 50 serves as the ground (GND) terminal. In the following description, 4-pin QFN package 50 will sometimes be referred to as LDO regulator device 50.

Referring to FIG. 5, 4-pin QFN package 50 includes an LDO regulator integrated circuit (semiconductor die 62) having a bottom surface attached to a die paddle 54 through a conductive die attach 63. Bond pads on the LDO regulator integrated circuit 62 are electrically connected to conductive leads of the leadframe through respective bond wires 65. The conductive leads form the perimeter lands 52 of the QFN package. 4-pin QFN package 50 is encapsulated by an encapsulant 56 with the conductive leads and the die paddle 54 being exposed along the bottom surface of the package. The exposed conductive leads form the perimeter lands 52 of package 50. The perimeter lands 52 may also be exposed along the side surfaces, perpendicular to the bottom surface, of the package.

In accordance with the 4-pin-plus-ground configuration of the present invention, none of the perimeter lands 52 is used as a ground pin. The perimeter lands 52 are assigned to the VIN, VOUT, EN and BYP terminals. Instead, the ground connection is taken from the exposed die paddle 54 which functions as a heat sink. Thus, in accordance with the present invention, the exposed die paddle 54 has dual function as a ground terminal and as a heat sink. The exposed die paddle 54 is electrically connected to the ground potential when the QFN package 50 is mounted on a printed wiring board (PWB). As thus configured, no down bond or leadframe to paddle bond is required to ground or stabilized the die paddle, as is required in conventional QFN packages. The 4-pin QFN package 50 can thus made with reduced complexity and cost.

The 4-pin-plus-ground configuration of the present invention exploits the low ground current characteristics of the LDO regulator to allow the ground current $I_{gnd}$ to pass from the semiconductor substrate of the LDO regulator integrated circuit 62 through conductive die attach 63 to the die paddle 54. When used in an application, the die paddle 54 is electrically grounded by wiring on the printed wiring board (PWB) to complete the electrical path for the ground current.

In most cases, the ground current $I_{gnd}$ of an LDO regulator is only about 1% of the power dissipated by the regulator. When passing the ground current through the semiconductor substrate of the LDO regulator integrated circuit 62, the resistance of the substrate will result in a voltage drop across the substrate. The voltage drop generated across the substrate as a result of passing the ground current through the substrate needs to be low enough to ensure that the substrate voltage drop does not adversely impact device operation. The amount of voltage drop across the substrate that can be tolerated by a device depends on the input voltage of the device. For example, in most cases, the voltage drop across the substrate as a result of the ground current should be less than 50 mV in most applications and less than 20 mV in some applications.

Semiconductor fabrication processes for manufacturing integrated circuits use a starting material of either a p-type substrate or an n-type substrate with the p-type substrate being more prevalent in CMOS devices. A lightly doped p-type substrate having a resistivity of 5 to 20 ohm-cm has been widely used in CMOS fabrication processes. In one embodiment, the LDO regulator integrated circuit 62 is built on a lightly doped p-type semiconductor substrate. Because the ground current of the LDO regulator is very low, using a lightly doped p-type substrate introduces only a small amount of substrate voltage drop. Specifically, the vertical parasitic resistance from the active areas to the bottom of the substrate for a lightly doped substrate having a sheet resistivity of 21 ohm-cm and a substrate thickness of 8 mils is about 40Ω. When the LDO regulator dissipates the maximum ground current of 120 µA, a substrate voltage drop of about 5 mV results. This small amount of substrate voltage drop will not adversely affect the operation of the LDO regulator.

Figure 6:
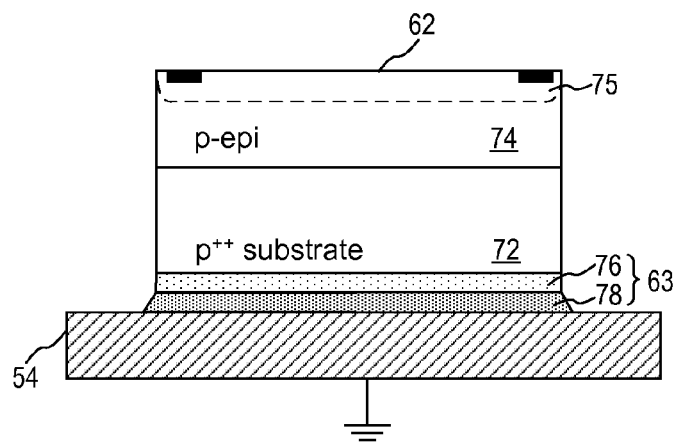
FIG. 6 is a cross-sectional view of the substrate used to form the LDO regulator integrated circuit according to one embodiment of the present invention.

According to another embodiment of the present invention, the LDO regulator integrated circuit 62 is fabricated using a low-resistance substrate to ensure a low-resistance current path for the ground current $I_{gnd}$ to flow through the bottom of the substrate to the die paddle 54. Referring to FIG. 6, the LDO regulator integrated circuit 62 is built using a heavily doped p-type semiconductor substrate with a lightly doped p-type epitaxy layer grown on top. A heavily doped p-type substrate is also referred to as a p++ substrate. The p++ substrate 74 can have a resistivity as low as 0.015 ohm-cm. While a heavily doped p++ substrate has been applied in the past in CMOS fabrication processes mainly for reducing latchup susceptibility, the heavily doped substrate is usually undesirable because it is more expensive and can introduce problems such as auto-doping in the manufacturing process.

In one embodiment, the heavily doped p++ substrate is either formed by using a heavily doped p++ starting material or by performing a blanket p++ implant on a p-type substrate. The p-type epitaxy layer is then formed on the heavily doped substrate using conventional epitaxial processes.

By using the heavily doped p++ substrate 72 to form the LDO regulator integrated circuit 62, significant reduction in the substrate resistance can be realized as compared with the conventional lightly-doped p-type substrate. For example, the vertical parasitic resistance from the active areas (denoted by dotted line region 75) to the bottom of the substrate is calculated for a conventional lightly doped substrate having sheet resistivity of 21 ohm-cm and for a heavily doped p++ substrate having sheet resistivity of 0.015 ohm-cm. The vertical resistance for the lightly doped substrate is about 40 ohms while the vertical resistance for the heavily doped p++ substrate is about 0.02 ohms. The heavily doped p++ substrate thus has a very small resistance so that any voltage drop across the substrate due to the ground current is negligible. In fact, for a substrate thickness of 8 mils, the voltage drop across a p++ substrate due to 120 µA of ground current is only about 2 µV, as opposed to 5 mV for the case where a lightly doped substrate is used.

Accordingly, the 4-pin-plus-ground configuration of the present invention can be applied to LDO regulator integrated circuit that is fabricated on a lightly-doped p-type substrate or on a heavily-doped p++ substrate. The selection of resistivity of the substrate is not critical to the practice of the present invention and is a matter of design choice based on the amount of substrate voltage drop that can be tolerated by passing the ground current through the substrate.

In the embodiment shown in FIG. 6, the conductive die attach 63 is a multi-layer structure providing a low resistance connection between the bottom of p++ substrate 72 and die paddle 54. Specifically, conductive die attach 63 includes a tri-metal layer 76 and a conductive epoxy layer 78. Tri-metal layer 44 is used to ensure a low resistance ohmic contact to the p++ silicon substrate 72. Tri-metal layer 76 also serves to improve the adhesion of the p++ substrate 72 to conductive epoxy layer 78. Conductive epoxy layer 78 is used to attach LDO regulator integrated circuit 62 from the tri-metal layer 76 to die paddle 54. Tri-metal layers for use as backside metallization are well known in the art and tri-metal layer 76 can be implemented using any one of the tri-metal layers, presently known or to be developed. Examples of tri-metal layers that can be used in the package of the present invention include Cr/Ni/Ag, Cr/NiV/Ag, Ti/Ni/Ag, and Ti/NiV/Ag (which are Chromium/Nickel/Silver, Chromium/Nickel-Vanadium/Silver, Titanium/Nickel/Silver or Titanium/Nickel-Vanadium/Silver). Other tri-metal layers can also be used as understood by one of ordinary skill in the art.

According to another aspect of the present invention, the QFN backside ground configuration technique can be applied to other electronic devices to eliminate the need to use a package pin as a ground pin. In general, an electronic device includes an integrated circuit formed on a semiconductor substrate and includes one or more input-output terminals and a ground terminal. In one embodiment, the QFN backside ground configuration of the present invention is applied to electronic devices that dissipate little ground current in operation. For instance, the QFN backside ground configuration can be applied when the ground current and the substrate resistance result in very small or negligible voltage drop across the substrate. In this manner, the package size for a low-ground-current electronic device can be reduced by eliminating the need for a package lead ground pin.

For instance, in one embodiment, the QFN backside ground configuration technique of the present invention is applied to a voltage reference device. Some voltage reference devices, such as LM4041 from Micrel, Inc., San Jose, Calif., have minimum operating current ranges of 60 to 80 µA. These types of low ground current devices is suitable for packaging with a QFN package using backside ground connection as the voltage drop across the substrate will be minimal.

When the QFN backside ground configuration technique is applied to a low-ground-current device, the device can be built using conventional lightly-doped substrate (p-type or n-type) as the small amount of ground current will not contribute to a significant amount of substrate voltage drop.

In another embodiment of the present invention, the QFN backside ground configuration of the present invention is applied to electronic devices that dissipate large amount of ground current in operation, such as ground currents in the range of 100 to 1000 mA. In that case, the electronic device can be fabricated on a heavily doped substrate (p-type or n-type) to ensure a sufficiently small amount of voltage drop across the substrate. For instance, when an electronic device dissipates 1000 mA of ground current, using a heavily doped substrate such as the p++ substrate of FIG. 6 will result in a substrate voltage drop of about 20 mV. A 20 mV to 50 mV substrate voltage drop is acceptable in most applications. Therefore, the QFN backside ground configuration of the present invention can be applied even when the ground current is large as long as a low resistivity substrate is used. In this manner, the package size for any electronic device can be reduced by eliminating the need for a package lead ground pin.

Furthermore, in the above description, a 4-pin QFN package for housing an LDO regulator is described. The use of a four pin package in the above description is illustrative only and is not intended to be limiting. The QFN backside ground configuration of the present invention can be applied to QFN packages having N number of package leads (pins) for eliminating the need to use a package lead as a ground pin, N being an integer.

The above detailed descriptions are provided to illustrate specific embodiments of the present invention and are not intended to be limiting. Numerous modifications and variations within the scope of the present invention are possible. The present invention is defined by the appended claims.

We claim:

1. A low dropout (LDO) regulator device comprising:
    an LDO regulator integrated circuit formed on a semiconductor substrate, the LDO regulator integrated circuit having an input terminal receiving an input voltage, an output terminal providing an output voltage, an enable terminal receiving an enable signal and a bypass terminal for stabilization;
    a 4-pin quad flat no-lead (QFN) package housing the LDO regulator integrated circuit, the 4-pin QFN package comprising:
        four conductive leads for connecting to the input terminal, the output terminal, the enable terminal and the bypass terminal of the LDO regulator integrated circuit through respective bond wires;
        a die paddle on which a bottom surface of the LDO regulator integrated circuit is attached using a conductive die attach, the die paddle forming the ground terminal of the LDO regulator integrated circuit; and
        an encapsulant encapsulating the four conductive leads, the bond wires, the LDO regulator integrated circuit, and the die paddle and exposing the bottom surface of the die paddle and at least bottom surfaces of the four conductive leads forming corresponding four perimeter lands,
    wherein the die paddle is at a ground potential to allow a ground current of the LDO regulator integrated circuit to flow through the substrate and the die paddle of the 4-pin QFN package.

2. The LDO regulator device of claim 1, wherein the semiconductor substrate comprises a lightly doped p-type substrate.

3. The LDO regulator device of claim 1, wherein the semiconductor substrate comprises a substrate structure comprising a lightly doped p-type epitaxy layer formed on a heavily doped p-type (p++) substrate.

4. The LDO regulator device of claim 3, wherein the heavily doped p-type (p++) substrate of the LDO regulator integrated circuit has a resistivity of about 0.015 ohm-cm.

5. The LDO regulator device of claim 1, wherein the exposed die paddle provides heat dissipation.

6. The LDO regulator device of claim 1, wherein the bypass terminal is to be coupled to a capacitor for stabilization.

7. The LDO regulator device of claim 1, wherein the conductive die attach comprises a tri-metal layer formed on the bottom surface of the LDO regulator integrated circuit and a conductor epoxy layer for attaching the tri-metal layer to the die paddle.

8. The LDO regulator device of claim 7, wherein the tri-metal layer comprises one of a Cr/Ni/Ag layer, a Cr/NiV/Ag layer, a Ti/Ni/Ag layer, and a Ti/NiV/Ag layer.

* * * * *